Nov. 10, 1964 B. C. FIORINO ETAL 3,156,875
CONSTANT AMPLITUDE, VARIABLE FREQUENCY SAWTOOTH GENERATOR
Filed June 14, 1961
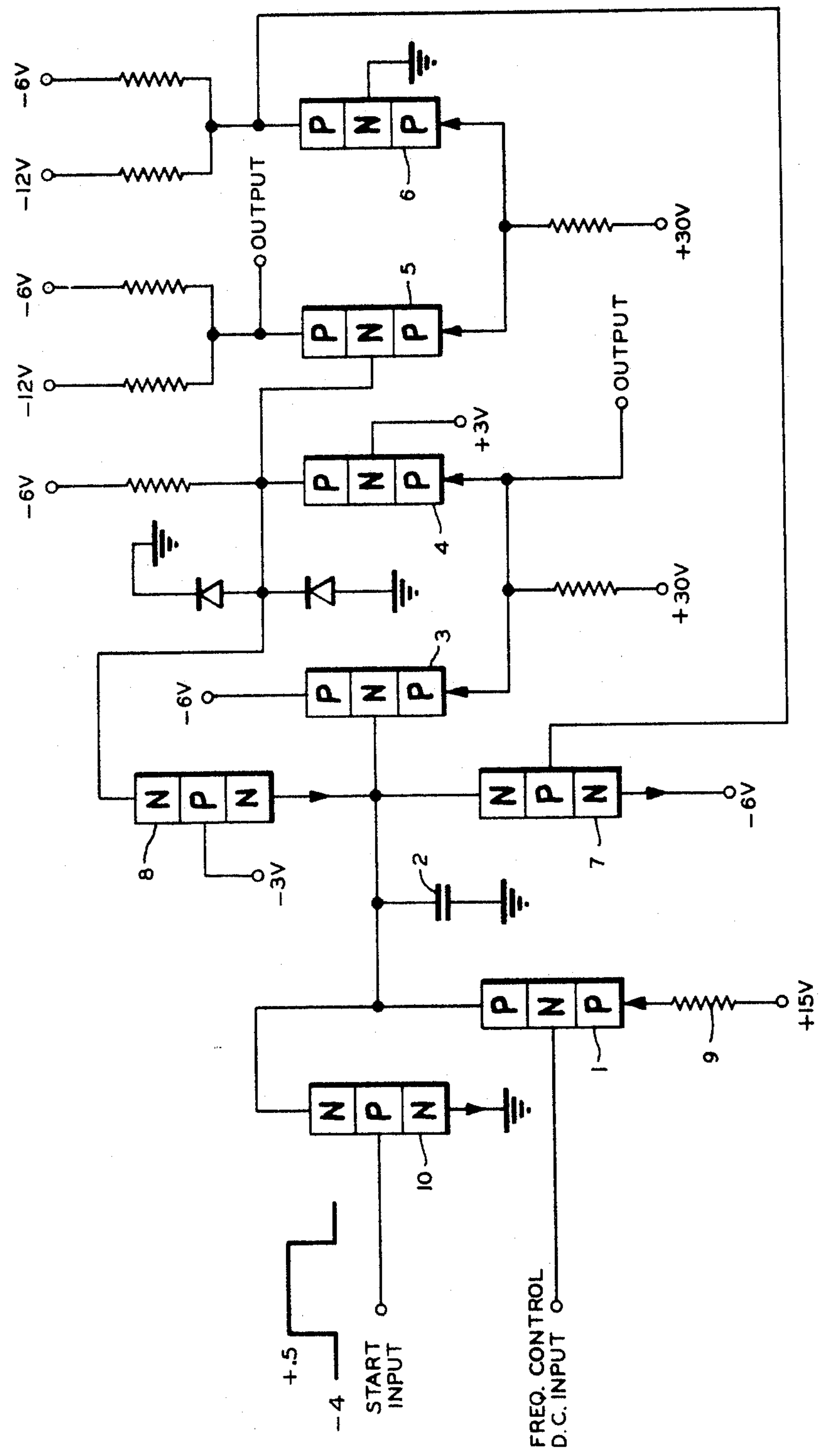

United States Patent Office 3,156,875
Patented Nov. 10, 1964

3,156,875
CONSTANT AMPLITUDE, VARIABLE FREQUENCY SAWTOOTH GENERATOR

Benjamin C. Fiorino and Alfred Brunschweiger, both of Poughkeepsie, N.Y., assignors to International Business Machines Corporation, New York, N.Y., a corporation of New York Filed June 14, 1961, Ser. No. 117,176
5 Claims. (Cl. 331—111)

This invention relates to variable frequency sawtooth generators and more particularly to a sawtooth generator in which the amplitude of the saw tooth is maintained constant independent of the repetition rate which varies in accordance with a variable input voltage.

Many applications require a variable frequency oscillator circuit in which the frequency of the output varies in accordance with the magnitude of an input voltage. Prior art circuits of this type have not been entirely satisfactory. For example, many prior art variable oscillators make use of variable inductors which are quite expensive and unreliable.

In accordance with our invention, a variable frequency sawtooth generator is provided for use in such applications. One of the requirements of such a circuit is that the amplitude of the sawtooth waveform remain constant, swinging between fixed reference levels regardless of the repetition rate. Further, it is desirable that the waveform of such a circuit pass through zero reference potential at exactly the half period point. Further, the circuit must have a frequency synchronizing capability over a wide range of input voltages. Such a circuit must be provided with simple starting means to give the sawtooth the proper phase relation with repect to input data and allow the circuit to synchronize with input data in the shortest period of time.

Accordingly, it is an object of the present invention to provide an improved variable frequency sawtooth generator utilizing components which are less expensive and more reliable than components used in prior art subjects.

It is a further object of the present invention to provide an improved variable frequency sawtooth generator having an increased frequency synchronizing range.

It is a further object of the present invention to provide an improved variable frequency sawtooth generator having a simple start circuit to provide the proper phasing between the sawtooth output and input data.

It is a still further object of the present invention to provide a variable frequency sawtooth generator having improved temperature stability and design flexibility.

In accordance with one embodiment of the invention, a transistor acting as a constant current generator is used to charge a capacitor through the high impedance of the collector circuit. When the voltage across the capacitor reaches a predetermined level, current is switched from one switching transistor to another. The resultant switch in voltage changes the conducting conditions of a second pair of switching transistors and this, in turn, turns on a transistor which provides a low impedance path for the capacitor to discharge. A clamping transistor limits the voltage excursion resulting from the discharge of the capacitor and, in addition, conduction of the clamping transistor initiates a switching action which turns off the transistor providing the low impedance path for the discharge of the capacitor. The turn-off of this transistor allows the capacitor to recharge and the cycle to be repeated. Means are also provided for gating the sawtooth generator on and off. A turn-on transistor provides a low impedance discharge path for the capacitor to ground. When the turn-on transistor is switched off, the capacitor begins charging from ground toward a positive reference level.

The foregoing and other objects, features and advantages of the invention will be apparent from the following more particular description of a preferred embodiment of the invention as illustrated in the accompanying drawing.

On the drawing:

The single figure of the drawing is a schematic diagram of the subject invention.

Referring to the drawing, a transistor 1 acts as a constant current source to charge capacitor 2. A first pair of switching transistors 3 and 4 are biased so that transistor 3 is normally conducting. However, when the capacitor 2 becomes charged to a voltage equal to +3 volts, current is switched from transistor 3 to transistor 4. A second pair of transistors 5 and 6 are biased so that transistor 5 is normally conducting. The turn-on of transistor 4 causes a positive shift in voltage at the base of transistor 5 and current is switched from transistor 5 to transistor 6. The turn-on of transistor 6 causes a positive shift in the voltage at the collector of transistor 6 and at the base of a transistor 7. This positive voltage shift at the base of transistor 7 causes transistor 7 to conduct and capacitor 2 is discharged toward −6 volts through this transistor. However, transistor 8 provides a clamp of the voltage on capacitor 2 at −3 volts. As the voltage on capacitor 2 approaches −3 volts, transistor 8 conducts. The collector of transistor 8, which is connected to the base of transistor 5, goes slightly negative and this negative going voltage turns transistor 5 on quite rapidly. This causes the fall of the discharge pulse at the collector of transistor 6 and the consequent turn-off of transistor 7. As soon as transistor 7 is turned off, the capacitor 2 begins charging positive once more and the cycle is repeated.

The frequency of the sawtooth generator is determined by the input stage of the generator including transistor 1, the emitter resistor 9, and capacitor 2 in the collector circuit. More particularly, the frequency of oscillation of the sawtooth generator is determined by the impedance of the input stage. The following mathematical expressions described the operation of the sawtooth generator. The charge on capacitor 2 is given by:

$$q=VC \quad (1)$$

where V is the voltage on capacitor 2, and C is the capacitance of capacitor 2.

The current flowing through transistor 1 to charge the capacitor is given by:

$$i=dq/dt=dVC/dt=Cdv/dt \quad (2)$$

Assuming that $dv$ is equal to 6 volts, as it is in the circuit shown in the drawing, that C equals 500 micromicrofarads, and the period of oscillation equals 6 microseconds then the current which must be supplied by transistor 1 is given by:

$$i=\frac{500\times10^{-12}\times6}{6\times10^{-6}} \tag{3}$$

$$i=500\times10^{-6}=.5\text{ ma.} \tag{4}$$

The above formula indicates that .50 milliamp of current are required to charge the capacitor. In an actual circuit arrangement, the value of current required under these conditions was measured at .568 milliamp. The shunt resistance, which is primarily the input impedance seen at the base of transistor 3, is in parallel with capacitor 2. The leakage current which is flowing through this shunt resistance accounts for the difference in calculated and actual charge current.

The frequency of oscillation of the circuit can be varied by changing the current delivered by the generator. The charging current is given by:

$$i=Cdv/dt \tag{5}$$

or $$dt=Cdv/i \tag{6}$$

Equation 6 above indicates that by increasing $i$, the period of oscillation is decreased. Similarly, by decreasing $i$, the period of oscillation is increased. By changing the voltage at the base of transistor 1, the current of the generator is varied.

In the operation of the circuit, several unique features should be particularly noticed. First, the self-generated pulse which is used to discharge the capacitor 2 is needed to produce a regenerative action that allows the sawtooth to free run. This pulse also limits the positive excursion of the voltage on the capacitor 2, never allowing the sawtooth to exceed a predetermined voltage. Since the negative swing of the sawtooth is also limited by the reference voltage applied to the base of transistor 8, the amplitude of the generated sawtooth is constant, swinging between fixed positive and negative reference levels. This amplitude is maintained independent of the repetition rate and allows the sawtooth to pass through zero potential at exactly the half period point.

Another important feature of the operation of the sawtooth generator is the provision of the turn-on transistor 10. When transistor 10 is turned which it is in the normal rest condition of the circuit, it provides a low impedance discharge path for capacitor 2 and the capacitor is discharged to ground. When the transistor 10 is turned off by the start input, the capacitor 2 begins charging toward a positive level from ground potential. Since the sawtooth waveform starts at ground potential instead of −3 volts, the sawtooth waveform has the proper phase relation with respect to input data and the output is synchronized with input data in the shortest period of time. Without such a start circuit the phase relationship between the output and input data is a random relationship which in extreme cases will prevent synchronism between the output and input data.

While the invention has been particularly shown and described with reference to a preferred embodiment thereof, it will be understood by those skilled in the art that various changes in form and details may be made therein without departing from the spirit and scope of the invention.

What is claimed is:

1. A sawtooth generator having an output frequency which varies in accordance with an input voltage comprising a capacitor, an input transistor, the collector and emitter of said input transistor being connected to provide a charging path for said capacitor, said input voltage being connected to the base of said input transistor, said input transistor providing a constant charging current to said capacitor for a given input voltage, means for discharging said capacitor, switching means responsive to the voltage across said capacitor for initiating an operation of said discharging means when the voltage across said capacitor reaches a first predetermined voltage, means for clamping the discharge of said capacitor at a second predetermined voltage, and means producing an output in accordance with the voltage across said capacitor whereby said output is a sawtooth waveform having an amplitude limited by said first and said second predetermined voltages and having a frequency in accordance with the magnitude of said input voltage.

2. The sawtooth generator recited in claim 1 and a circuit for starting said sawtooth generator in response to a start voltage, said starting circuit including means for selectively clamping the voltage across said capacitor at ground potential.

3. The sawtooth generator recited in claim 2 wherein said means for selectively clamping the voltage across said capacitor at ground potential includes a transistor, the collector and emitter of said transistor being connected between ground potential and said capacitor, said transistor being normally biased in the conducting condition, said starting voltage being applied to the base of said transistor to switch said transistor in the nonconducting condition.

4. The sawtooth generator recited in claim 1 wherein said switching means includes a pair of switching transistors, one of said pair being normally biased in the conducting condition and the other of said pair being normally biased in the nonconducting condition, said switching means being connected to said capacitor and including means to render the same responsive to the charging of said capacitor to a first predetermined voltage for switching the conducting conditions of said pair of switching transistors, said discharging means including a discharge transistor connected between a third predetermined voltage and said capacitor, means coupling said switching means to said discharge transistor so that said discharge transistor is turned on in response to the switching of said pair of transistors, a clamping transistor having emitter and collector electrodes connected to provide a path to supply current to said capacitor, said clamping transistor being biased so as to be normally non-conductive, but to become conductive in response to the dropping of the voltage on said capacitor to said second predetermined voltage, and means responsive to the change of said clamping transistor to the conductive condition for switching the conducting states of said pair of switching transistors.

5. A sawtooth generator having an output frequency which varies in accordance with an input voltage comprising a capacitor, an input transistor, the collector and emitter of said input transistor being connected to provide a charging path for said capacitor, said input voltage being connected to the base of said input transistor, said input transistor providing a constant charging current to said capacitor for a given input voltage, a switching circuit comprising a pair of switching transistors, one of said pair being normally biased in the conducting condition and the other of said pair being normally biased in the nonconducting condition, means coupling said switching circuit to said capacitor so as to be responsive to the charging of said capacitor to a first predetermined voltage for switching the conducting conditions of said pair of switching transistors, a discharge transistor having a control electrode and emitter and collector electrodes connected between a third predetermined voltage and said capacitor, means coupling said switching circuit to said control electrode so that said discharge transistor is turned on in response to the switching of said pair of switching transistors, a clamping transistor having emitter and collector electrodes connected to supply current to said capacitor, said clamping transistor being biased so as to be normally nonconductive, but to become conductive in response to the dropping of the voltage on said capacitor to a second predetermined voltage, means responsive to the change of said clamping transistor to the conductive condition for switching the conducting states of said pair of switching transistors, and terminal means coupled to said capacitor for delivering an output in accordance with the voltage across said capacitor whereby said output is a sawtooth waveform having an amplitude limited by said first and said second predetermined voltages and having a frequency in accordance with the magnitude of said input voltage.

References Cited in the file of this patent

UNITED STATES PATENTS

| | | |
|---|---|---|
| 2,180,364 | Norton | Nov. 21, 1939 |
| 2,492,018 | Sunstein | Dec. 20, 1949 |
| 2,627,031 | Moore | June 27, 1953 |
| 2,891,173 | Helbig | June 16, 1959 |

FOREIGN PATENTS

| | | |
|---|---|---|
| 855,332 | Great Britain | Nov. 30, 1960 |